(12) United States Patent
Fujimori

(10) Patent No.: US 7,871,917 B2
(45) Date of Patent: Jan. 18, 2011

(54) SEMICONDUCTOR DEVICE AND MANUFACTURING METHOD FOR THE SAME

(75) Inventor: Joji Fujimori, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 56 days.

(21) Appl. No.: 11/443,103

(22) Filed: May 31, 2006

(65) Prior Publication Data

US 2007/0197016 A1 Aug. 23, 2007

(30) Foreign Application Priority Data

Feb. 17, 2006 (JP) .............................. 2006-040866

(51) Int. Cl.
*H01L 21/44* (2006.01)
(52) U.S. Cl. .................... 438/613; 438/612; 257/779
(58) Field of Classification Search ............... 438/612, 438/613; 257/779
See application file for complete search history.

(56) References Cited

U.S. PATENT DOCUMENTS

| | | | |
|---|---|---|---|
| 5,046,161 A | 9/1991 | Takada | |
| 6,060,771 A | 5/2000 | Tomikawa et al. | |
| 6,108,210 A | 8/2000 | Chung | |
| 6,274,008 B1 | 8/2001 | Gopalraja et al. | |
| 6,593,220 B1* | 7/2003 | Yu et al. | 438/612 |
| 7,183,192 B2* | 2/2007 | Park et al. | 438/614 |
| 2002/0111009 A1* | 8/2002 | Huang et al. | 438/613 |
| 2003/0135997 A1 | 7/2003 | Watanabe et al. | |
| 2004/0046252 A1 | 3/2004 | Fujimori et al. | |
| 2004/0137707 A1* | 7/2004 | Lei et al. | 438/612 |
| 2005/0014355 A1* | 1/2005 | Chan et al. | 438/613 |
| 2005/0170640 A1* | 8/2005 | Nakagawa et al. | 438/631 |
| 2006/0030071 A1* | 2/2006 | Mizukoshi et al. | 438/106 |
| 2006/0175686 A1* | 8/2006 | Murata et al. | 257/642 |

FOREIGN PATENT DOCUMENTS

JP  8-162456 A  6/1996

(Continued)

OTHER PUBLICATIONS

Chinese Office Action issued in Chinese Appln. 200610100027.3 issued Jan. 4, 2008.

(Continued)

*Primary Examiner*—Fernando L Toledo
(74) *Attorney, Agent, or Firm*—Westerman, Hattori, Daniels & Adrian, LLP

(57) ABSTRACT

To provide a low-cost, easy-to-use, and efficient method for manufacturing a semiconductor device, which eliminates the need for the formation or removal of barrier metals upon formation of bumps, and a high-performance semiconductor device with fine bumps arranged at a narrow pitch. The method includes: forming a plurality of electrode pads 12 on one surface of a semiconductor substrate 10; forming insulating layers (e.g., inorganic insulating layer 14 and organic insulating layer 16) to cover the perimeter of each electrode pad 12; selectively forming a mask layer 20 on the insulating layers 14 and 16; cleaning the surface of the electrode pads 12 which is not covered with the insulating layers 14 and 16; forming external terminals 46 in regions defined by the insulating layers 14 and 16 and mask layer 20 so that they are in contact with the electrode pads 12; and removing the mask layer 20.

14 Claims, 7 Drawing Sheets

FOREIGN PATENT DOCUMENTS

| | | |
|---|---|---|
| JP | 2002-111192 A | 4/2002 |
| JP | 2002-231855 A | 8/2002 |
| JP | 2004-128354 A | 4/2004 |

OTHER PUBLICATIONS

Taiwanese Office Action issued in 095119164, issued Mar. 27, 2008.

Taiwanese Office Action dated Nov. 27, 2008, issued in corresponding Taiwanese Application No. 095119164.

Taiwanese Office Action dated Aug. 31, 2009, issued in corresponding Taiwanese Patent Application No. 95119164 w/partial English translation.

* cited by examiner

SEMICONDUCTOR DEVICE AND MANUFACTURING METHOD FOR THE SAME

CROSS-REFERENCE TO RELATED APPLICATIONS

This application is based upon and claims the benefits of the priority from the prior Japanese Patent Application No. 2006-040866 filed on Feb. 17, 2006, the entire contents of which are incorporated herein by reference.

BACKGROUND OF THE INVENTION

1. Field of the Invention

The present invention relates to a low-cost, easy-to-use, and efficient method for manufacturing a semiconductor device, which eliminates the need for the formation or removal of barrier metals upon formation of bumps, and to a high-performance semiconductor device with fine bumps arranged at a narrow pitch.

2. Description of the Related Art

Attempts have been made in recent years to achieve downsizing of semiconductor devices and greater packaging density, with the trend moving toward for thinner, smaller electronic devices. Against this background, the trend towards finer electrode pitch in a semiconductor device has created a new demand to achieve fine pitch bump—nowadays, for example, pillar-shaped electrodes (bumps) have been used suitably. Now, an example of a conventional semiconductor device is shown in FIG. 9.

In the semiconductor device shown in FIG. 9, equally spaced electrode pads 510 are formed on one surface of a semiconductor substrate 500, and a cover film 520 is formed thereon in such a way as to cover the space between each of the electrode pads 510. A protective film 530 runs on the semiconductor substrate 500 in such a way as to cover the entire surface of the cover film 520, including a part of each electrode pad 510. Solder bumps 550 are formed on the electrode pads 510, with barrier metals 540 being interposed between them. The barrier metal 540 has a function of increasing the adhesion between the electrode pad 510 and the solder bump 550.

In such an external terminal configuration it is required that the barrier metals 540 be also miniaturized, with a reduction in bump pitch. This miniaturization is, however, difficult to achieve and results in undesirable cost increase. Moreover, when such solder bumps are used, they become nearly spherical in a reflow process, making it difficult to achieve finer bump pitch. Note in such a conventional semiconductor device that bumps can be formed at a pitch of about 170 μm to 220 μm.

There are some proposed methods that can be adopted for the formation of the bumps: A method that provides openings around electrodes formed on a covered circuit board and embeds solder, which has been supplied to the circuit board under reduced pressure, in the openings by use of a squeegee (see Japanese Patent Application Laid-Open (JP-A) No. 2004-128354); and a method that prints solder paste under reduced pressure onto a printed wiring board having solder pads (see Japanese Patent Application Laid-Open (JP-A) No. 2002-111192). Bumps formed with these methods, however, have a problem that bump pitch is not narrow enough, because they are formed of solder and thus become spherical in a reflow process.

In addition, there is a known method that utilizes electroplating for the formation of bumps. With this method, a barrier metal is generally formed between a bump and an interconnection (or pad). Such a barrier metal has an advantage that it increases the adhesion between the bump and pad and functions as a common electrode upon formation of the bump on the pad by electroplating. The trend moving toward for finer bump pitch has been requiring miniaturization of barrier metals; however, this is difficult to achieve and results in undesirable cost increase, running counter to the tendency to reduce the cost per semiconductor device and package.

Moreover, the following has also been proposed as a bump formation method: A barrier metal formation process is omitted by forming an antireflection film, which is made of the same material as a barrier metal, on the surface of a pad, and the antireflection film is then used as a common electrode during electroplating for the formation of bumps (see Japanese Patent Application Laid-Open (JP-A) No. 8-162456). With this method, however, an unnecessary interconnection layer is exposed to the outside after the formation of bumps, which needs to be removed. For this reason, a process similar to a conventional barrier removal process is required, and this method is not satisfactory in terms of the simplification of the manufacturing process.

Accordingly, a low-cost, easy-to-use, and efficient method for manufacturing a semiconductor device, which eliminates the need for the formation or removal of barrier metals upon formation of bumps and which can form bumps at a narrow pitch, and a high-performance semiconductor device with fine bumps arranged at a narrow pitch have yet been provided.

It is an object of the present invention to solve the foregoing conventional problems and to achieve the objects described below. Specifically, it is an object of the present invention to provide a low-cost, easy-to-use, and efficient method for manufacturing a semiconductor device, which eliminates the need for the formation or removal of barrier metals upon formation of bumps, and to a high-performance semiconductor device with fine bumps arranged at a narrow pitch.

SUMMARY OF THE INVENTION

The following is the means for solving the foregoing problems.

The method of the present invention for forming a semiconductor device includes: forming a plurality of electrode pads on one surface of a semiconductor substrate; forming an insulating layer so as to cover the perimeter of each of the electrode pads; selectively forming a mask layer on the insulating layer; cleaning the surface of the electrode pads which is not covered with the insulating layer; forming external terminals in regions defined by the insulating layer and the mask layer in such a way that the external terminals are in contact with the electrode pads; and removing the mask layer.

In this method, the plurality of electrode pads is first formed on one surface of the semiconductor substrate. The insulating layer is so formed that it covers the perimeter of each electrode pad. The mask layer is selectively formed on the insulating layer. The surface of the electrode pads, which is not covered with the insulating layer, is cleaned. The external terminals are formed in regions defined by the insulating layer and the mask layer in such a way that they are in contact with the electrode pads. Finally, the mask layer is removed. In the step of removing the mask layer, the electrode pads are never exposed. For example, when barrier metals are formed on the semiconductor substrate and bumps (external terminals) are formed on the barrier metals, a part of the exposed portion of the barrier metal needs to be removed. In the method of the present invention, however, there is no need to form such barrier metals and to remove them. Thus, with the method of the present invention, it is possible to manufacture a semiconductor device that has bumps arranged at a narrow pitch easily, efficiently, and inexpensively.

The semiconductor device of the present invention includes: a plurality of electrode pads formed on one surface of a semiconductor substrate; an insulating layer covering the perimeter of each of the electrode pads; and external terminals formed on the electrode pads so as to be in contact with the electrode pads, the external terminals having a flat surface that is substantially parallel to the surface of the electrode pads.

In the semiconductor device of the present invention the external terminals are in direct contact with the electrode pads, and generally, there are no barrier metals formed between the external terminal and the electrode pad.

The semiconductor device of the present invention has fine bumps arranged at a narrow pitch and is of high performance.

DESCRIPTION OF THE PREFERRED EMBODIMENTS

Hereinafter, the semiconductor device of the present invention and the method of the present invention for manufacturing a semiconductor device will be described with reference to Examples, which however shall not be construed as limiting the invention thereto.

EXAMPLE 1

The First Example of the method of the present invention for manufacturing a semiconductor device will be described with reference to the drawings.

In accordance with a given wafer process, a plurality of semiconductor devices are formed on the upper surface (one surface) of a semiconductor substrate (wafer) 10 made of silicon (Si).

Figure 1A:
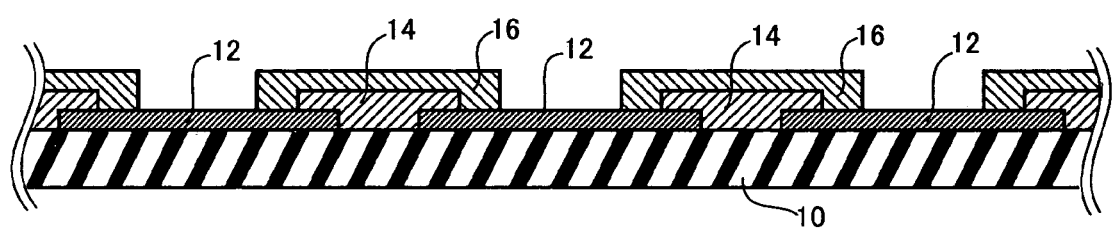
FIG. 1A is a first cross-sectional view for explaining the First Example (Example 1) of a method of the present invention for manufacturing a semiconductor device.

As shown in FIG. 1A, an inorganic insulating layer 14 is then selectively formed on the semiconductor device in such a way as to cover the perimeter of each electrode pad 12 that constitutes an external terminal of the semiconductor device, so that a part of the external terminal is selectively exposed. In addition, an organic insulating layer 16 is formed thereon so as to cover the top and side surface of the inorganic insulating layer 14.

Examples of the materials constituting the electrode pads 12 include materials mainly composed of aluminum (Al) (e.g., Al—Cu, Al—Si, and Al—Cu—Ti) and copper (Cu), and the thickness of the electrode pads 12 is set to about 0.5 µm to 2 µm.

The inorganic insulating layer 14 is laminate formed of a under layer made of silicon oxide ($SiO_2$) and an upper layer made of silicon nitride (SiN), and is provided to a thickness of about 300 µm to 800 µm.

The organic insulating layer 16 is made of polyimide resin, and is provided to a thickness of about 1 µm to 20 µm.

With such an organic insulating layer 16 arrangement, it is possible to prevent the entry of water through the gap left between the inorganic insulating layer 14 and electrode pads 12 and to reduce mechanical stress on external terminals (bumps) to be described later.

Figure 1B:
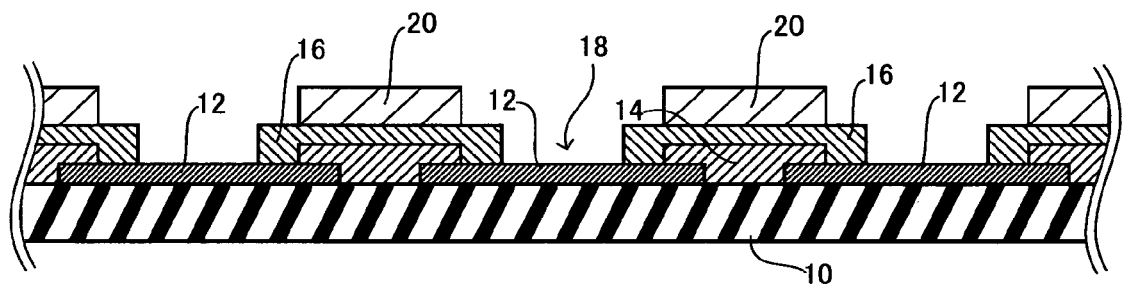
FIG. 1B is a second cross-sectional view for explaining the First Example (Example 1) of the method of the present invention for manufacturing a semiconductor device.

Next, a photoresist layer is formed on the semiconductor device so as to cover both the organic insulating layer 16 and the exposed electrode pads 12, followed by selective exposure and development for the photoresist layer to thereby form a photoresist layer 20 having openings 18 at positions corresponding to the electrode pads 12, as shown in FIG. 1B.

Figure 2A:
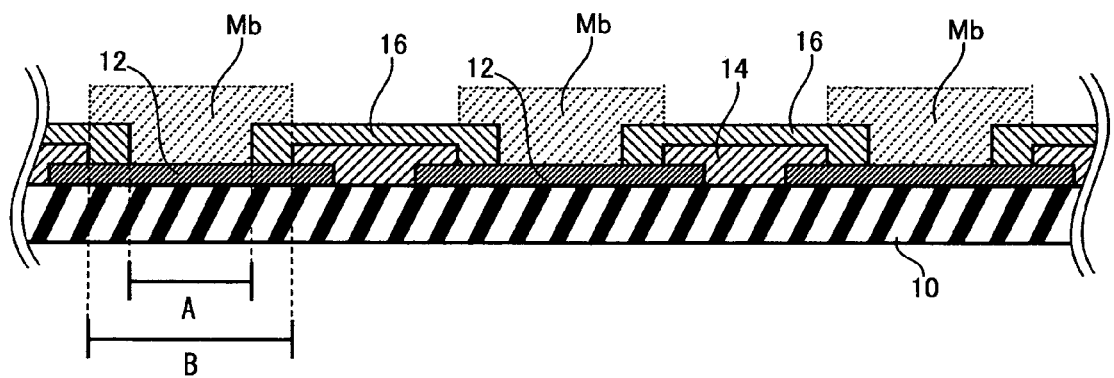
FIG. 2A is a schematic view showing an example of the relationship between the opening dimension A defined by an organic insulating layer and the opening dimension B of an external terminal to be formed, in the First Example (Example 1) of the method of the present invention for manufacturing a semiconductor device.
Figure 2B:
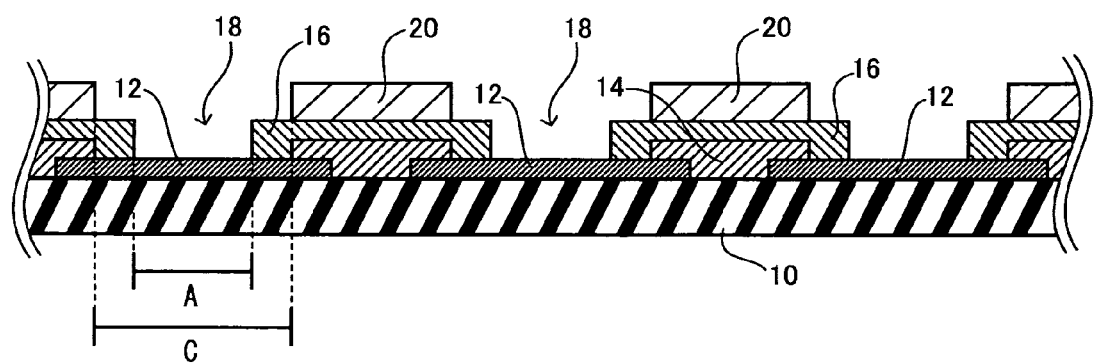
FIG. 2B is a schematic view showing an example of the relationship between the opening dimension A defined by the organic insulating layer and the opening dimension C in a photoresist layer, in the First Example (Example 1) of the method of the present invention for manufacturing a semiconductor device.

The photoresist layer 20 serves as a mask layer in a process described below. In this process, the pattern of the photoresist layer 20 is so designed that a part of the top of the organic insulating layer 16 which selectively covers the electrode pads 12 is exposed at the openings. That is, the photoresist layer 20 is disposed on the semiconductor device in such a manner that both the electrode pads 12 and organic insulating layer 16 are partially exposed. More specifically, if it is assumed that the photoresist 20 has been removed as shown in FIG. 2A, external terminals (bumps) Mb are formed in such a way that they have a dimension B to extend over the surface of the organic insulating layer 16, exceeding the opening dimension A defined by the organic insulating layer 16 (i.e., A<B). In addition, the opening dimension C of the photoresist 20 is made larger than the opening dimension A (i.e., A<C), as shown in FIG. 2B.

Note that the photoresist material constituting the photoresist layer 20 may be formed either of positive photoresist materials or negative photoresist materials, and is selected depending on the pattern precision required, for example on the wavelength of exposure light (e.g., g-line, i-line, or KrF). Any of solution type-photoresist materials and film (sheet) type-photoresist materials can be adopted. The thickness of the photoresist layer 20 is set to about 150 μm.

Figure 3:
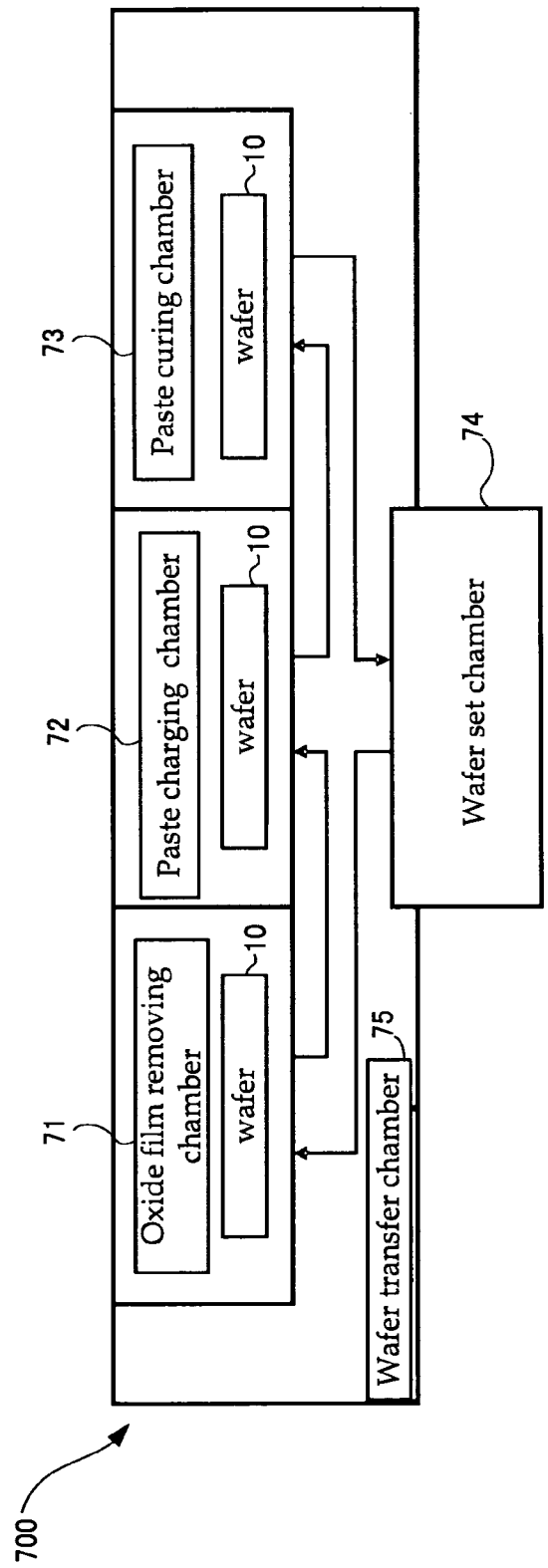
FIG. 3 is a schematic view of an example of a bump-formation device used in the First Example (Example 1) of the method of the present invention for manufacturing a semiconductor device.

Using a bump-formation device 700 whose schematic configuration is shown in FIG. 3, external terminals (bumps) are formed on the semiconductor substrate (wafer) 10 where a mask layer is formed that is formed of the photoresist layer 20.

The bump-formation device 700 includes a first processing chamber 71 for removing an oxide film present on the exposed surface of each electrode pad 12 in the semiconductor devises formed on the semiconductor wafer 10, a second processing chamber 72 for charging paste containing metallic materials for bumps into regions defined by the photoresist layer 20, and a third processing chamber 73 for heating the paste.

A transfer arm (not shown) in a wafer transfer chamber 75 transfers the semiconductor wafer 10 from one chamber to another or from a wafer set chamber 74 to one chamber. The bump-formation device 700 is maintained under vacuum or reduced pressure and accordingly, each chamber is properly maintained under vacuum or reduced pressure.

A given number of the semiconductor wafers 10 are first placed into the wafer set chamber 74 of the bump-formation device 700, and each processing chamber is exhausted to form a vacuum.

Figure 4A:
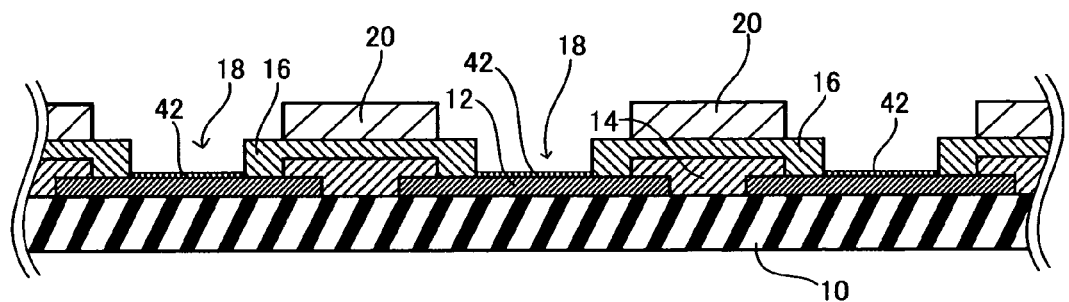
FIG. 4A is a third cross-sectional view for explaining the First Example (Example 1) of the method of the present invention for manufacturing a semiconductor device, showing the step performed after the step of FIG. 1B.

Subsequently, one of the semiconductor wafers 10 housed in the wafer set chamber 74 is transferred to the first processing chamber (oxide film removing chamber) 71 by the transfer arm. In the first processing chamber 71, an oxide film present on the exposed surface of the electrode pads 12 of each of the semiconductor devices formed on the semiconductor wafer 10 is removed. More specifically, as shown in FIG. 4A, an oxide film 42 present on the exposed surface of each electrode pad 12 in the opening 18 defined by the organic insulating layer 16 is removed, allowing the surface of the metal layer of each electrode pad 12 to be exposed at the opening 18.

The oxide film 42 can be removed through a cleaning process in which mixed gas of $CHF_3$ and $O_2$, mixed gas of $CHF_4$ and $O_2$, $O_2$ gas, or $N_2$ gas is used. This cleaning process is preferably performed at a temperature of 20° C. to 200° C. and at an output of 0.5 kW to 2.0 kW.

Alternatively, the oxide film 42 can be removed with a RF sputtering method using either argon (Ar) gas or nitrogen ($N_2$) gas, or with a reduction process using formic acid gas. When the RF sputtering method is employed, this method is preferably performed at a temperature of 50° C. to 200° C. and at an output of 0.5 kW to 2.0 kW. Meanwhile, when the reduction process is employed, this process is preferably performed at a temperature of 20° C. to 200° C.

The semiconductor wafer 10, where the oxide films 42 present on the electrode pads 12 exposed at the openings 18 have been removed in the first processing chamber 71, is then transferred by the transfer arm to the second processing chamber (paste charging chamber) 72 from the first processing chamber 71. At this point, the bump-formation device 700 is maintained under vacuum or reduced pressure and each chamber is properly maintained under vacuum or reduced pressure, thereby preventing oxidization of the surface of the electrode pads 12 of the semiconductor devices formed on the semiconductor wafer 10.

Figure 4B:
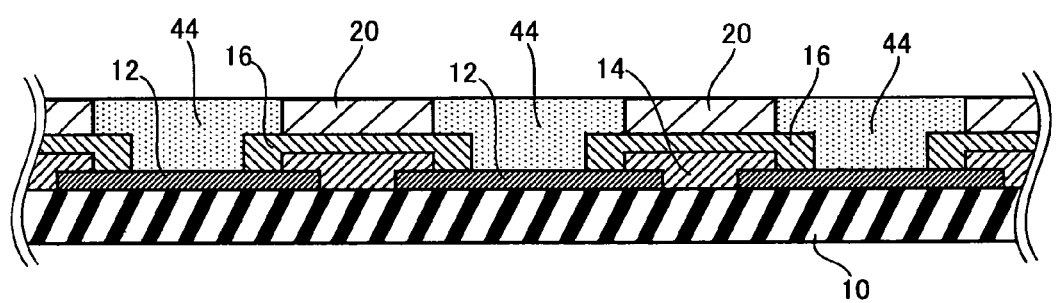
FIG. 4B is a fourth cross-sectional view for explaining the First Example (Example 1) of the method of the present invention for manufacturing a semiconductor device.

In the second processing chamber 72, metallic material-containing paste is then charged in regions defined by the photoresist 20, i.e., the metallic material-containing paste is placed on the exposed surface of the electrode pads 12 of each semiconductor device formed on the semiconductor wafer 10. More specifically, conductive paste 44 made of resin containing metallic particles (powders) is charged in the regions defined by the photoresist 20 to a level as high as the top of the photoresist 20 under vacuum or reduced pressure. This state is shown in FIG. 4B.

Note that since the second processing chamber 72 is maintained under vacuum or reduced pressure upon charging of the conductive paste 44, no air enters the openings 18 that are provided above the electrode pads 12 and are defined by the organic insulating layer 16. Thus, it is possible to charge the conductive paste 44 without inclusion of air bubbles (voids).

The materials for the metallic particles (powders) are not particularly limited and can be appropriately selected depending on the intended purpose; examples include copper (Cu), gold (Au), nickel (Ni), palladium (Pd), platinum (Pt), indium (In), germanium (Ge), antimony (Sb) and zinc (Zn). These metals may be used singly or in combination; mixtures of two or more different metals, alloys these metals, and mixtures of the alloys can be used.

Meanwhile, thermosetting resins can be employed for the resin. Such thermosetting resins, however, are required to be cured at temperatures below the melting points of the metals to be employed. For this reason, epoxy resins are employed when copper (Cu, melting point: 1,083° C.) is employed.

In addition to thermosetting resins, photocurable resins can also be employed.

The content of the metallic particles (powders) is not particularly limited and can be appropriately determined depending on the intended purpose; for example, the metal-resin ratio is preferably 95:5 to 70:30 by mass.

The semiconductor wafer 10, where the conductive paste 44 has been placed on the electrode pads 12 exposed at the openings 18 in the second processing chamber 72, is then transferred by the transfer arm to the third processing chamber (paste curing chamber) 73 from the second processing chamber 72. At this point, the bump-formation device 700 is maintained under vacuum or reduced pressure and each chamber is properly maintained under vacuum or reduced pressure.

Figure 4C:
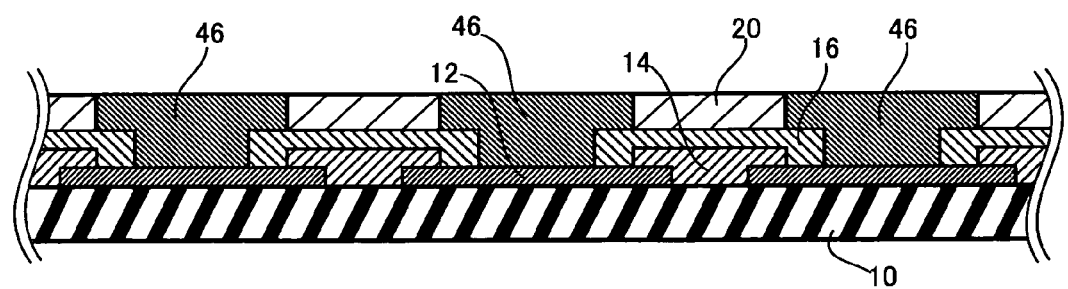
FIG. 4C is a fifth cross-sectional view for explaining the First Example (Example 1) of the method of the present invention for manufacturing a semiconductor device.

In the third processing chamber 73, the semiconductor wafer 10 is heated under vacuum or reduced pressure to cure the conductive paste 44 to form external terminals (bumps) 46. This state is shown in FIG. 4C.

During this heating process the third processing chamber 73 is maintained under vacuum or reduced pressure. For this reason, even when gas has been emitted from the conductive paste 44, there is no likelihood that the gas is incorporated into the external terminals (bumps) 46.

The heating temperature in this process is determined according to the resin material constituting the conductive paste 44 and metallic material contained in the resin material. If the conductive paste 44 is made of epoxy resin as described above, it is heated to about 200° C.

In this Example, upon formation of the external terminals on the electrode pads of each semiconductor device formed on the semiconductor wafer, both the cleaning process that involves removal of oxide films present on the electrode pads and the formation process for the external terminals (bumps) on the electrode pads are performed under vacuum or reduced pressure, as described above. In this way resin paste—designed for the formation of external terminals (bumps)—is placed on the external terminals, covering the external terminals. At this point, neither insulating substances (e.g., oxide films) nor voids are generated between the electrode pad and resin paste, thereby providing high adhesion between the electrode pad and external terminal (bump) and ensuring a low resistance electrical connection and high mechanical bonding strength between them.

The semiconductor wafer 10, which has been subjected to the heating process in the third processing chamber 73 to form the external terminals (bumps) 46 on the electrode pads 12, is then transferred by the transfer arm to the wafer set chamber 74 from the third processing chamber 73.

After returning the wafer set chamber 74 pressure to atmospheric pressure, the semiconductor wafer 10 is taken out of the wafer set chamber 74, and the photoresist layer 20 on the semiconductor wafer 10 is removed by dissolving it with an etchant such as an alkali solvent or by peeling it from the semiconductor wafer 10. In this way a plurality of distinct external terminals (bumps) 46, each having a nearly flat top surface, is formed on the semiconductor wafer 10. This state is shown in FIG. 5.

Figure 5:
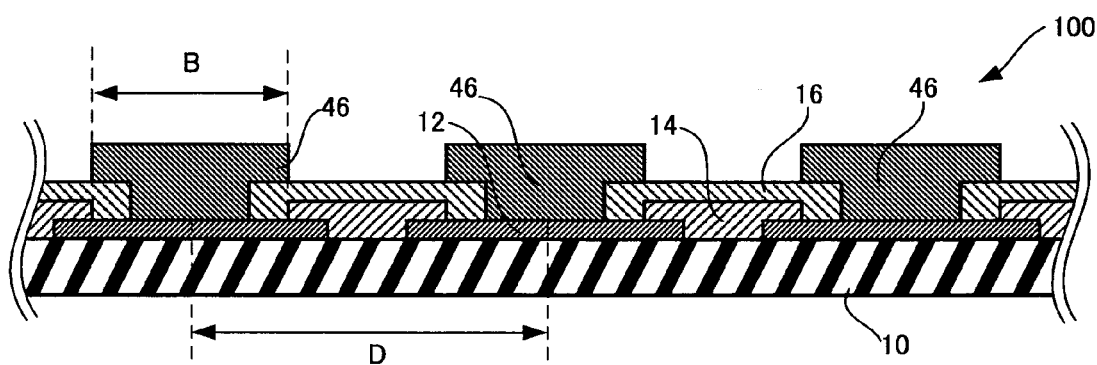
FIG. 5 is a vertical cross-sectional schematic view showing the First Example (Example 1) of a semiconductor device of the present invention.

In a semiconductor device 100 having the external terminals (bumps) 46 arranged on the electrode pads 12, no so-called barrier layer is formed at the interface between the electrode pad 12 and external terminal (bump) 46 as shown in FIG. 5. This means that the need for the preparation of materials for such a barrier layer and the formation process is eliminated. In addition, high adhesion is provided between the electrode pad 12 and external terminal (bump) 46, and a low resistance electrical connection and high mechanical bonding strength is ensured between them.

As described earlier, there is a trend for increasing the number of external terminals (bumps) in a semiconductor device along with the demand for ever-miniaturized, ever-denser, and ever-high performance semiconductor devices. Accordingly, the horizontal dimension B of each external terminal (bump) along the cross section of the semiconductor device (see FIG. 5) needs to be set to 100 μm or less, and recently, set to as small as 20 μm to 30 μm. Moreover, the distance between the adjacent external terminals (bumps), or terminal pitch D (see FIG. 5), needs to be set to 150 μm or less, and recently, set to as small as 130 μm or less.

To achieve this, the semiconductor device of the present invention is so designed that the external terminals (bumps) 46 have a flat surface that is substantially parallel to the surface of the electrode pads 12. Thus, the height (thickness) of the bumps 46 of the semiconductor device of the present invention is smaller than that of conventional spherical bumps; therefore, it is possible to achieve downsizing and slimming down of semiconductor devices.

Note that although the external terminals (bumps) 46 of the semiconductor device of this Example are as high (thick) as the photoresist layer 20 as described above, the height (thickness) of the external terminals (bumps) 46 is not necessarily the same as that of the photoresist layer 20; it is only necessary that the height (thickness) of the external terminals (bumps) 46 be at least two-thirds of the height (thickness) of the photoresist layer 20.

It should be noted that various modifications can be made to the semiconductor device of the present invention as demonstrated in Examples described below.

EXAMPLE 2

Figure 6:
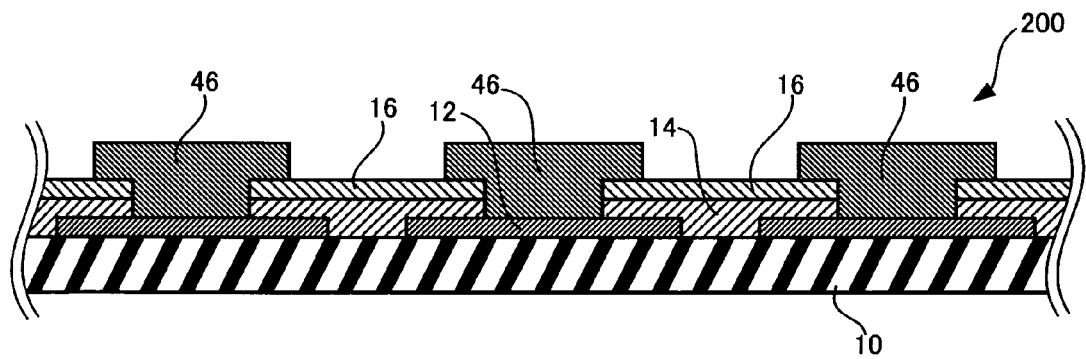
FIG. 6 is a vertical cross-sectional schematic view showing the Second Example (Example 2) of the semiconductor device of the present invention.

The Second Example of the semiconductor device of the present invention is shown in FIG. 6.

In a semiconductor device 200 shown in FIG. 6, the organic insulating layer 16 is formed on the inorganic insulating layer 14 in such a way that it never covers the side surface of the inorganic insulating layer 14. More specifically, the organic insulating layer 16 and inorganic insulating layer 14 have the same pattern.

With this configuration, processing of both of the insulating layers (i.e., the organic insulating layer 16 and inorganic insulating layer 14) defining the openings through which the electrode pads 12 are exposed becomes easy, and it is also made possible to reduce the dimension of the openings.

The external terminals (bumps) 46 contact the electrode pads 12, with no so-called barrier layers interposed therebetween, and partially extend over the surface of the inorganic insulating layer 14.

Also with this configuration, a formation process for barrier metals can be omitted, thereby enabling low-cost formation of fine external terminals (bumps) arranged at a bump pitch.

EXAMPLE 3

Figure 7:
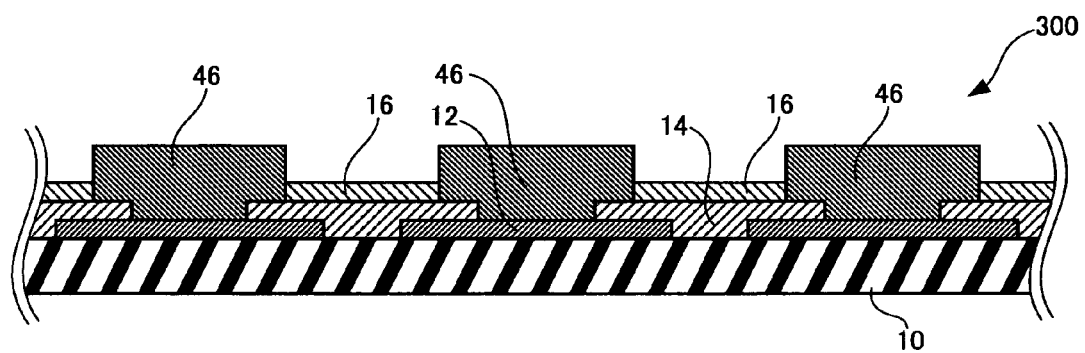
FIG. 7 is a vertical cross-sectional schematic view showing the Third Example (Example 3) of the semiconductor device of the present invention.

The Third Example of the semiconductor device of the present invention is shown in FIG. 7.

In a semiconductor device 300 shown in FIG. 7, the organic insulating layer 16 is formed on the inorganic insulating layer 14 in such a way that it never covers the side surface of the inorganic insulating layer 14 and that its end is in contact with the side surface of each external terminal (bump).

With this configuration, while it is possible to reduce the precision requirement for the processing of the organic insulating layer 16, it is possible to process the inorganic insulating layer 14 with high precision and thus to further reduce the dimension of the openings.

The external terminals (bumps) 46 contact the electrode pads 12, with no so-called barrier layers interposed therebetween, and partially extend over the surface of the inorganic insulating layer 14.

Also with this configuration, a formation process for barrier metals can be omitted, thereby enabling low-cost formation of fine external terminals (bumps) arranged at a narrow pitch.

EXAMPLE 4

Figure 8:
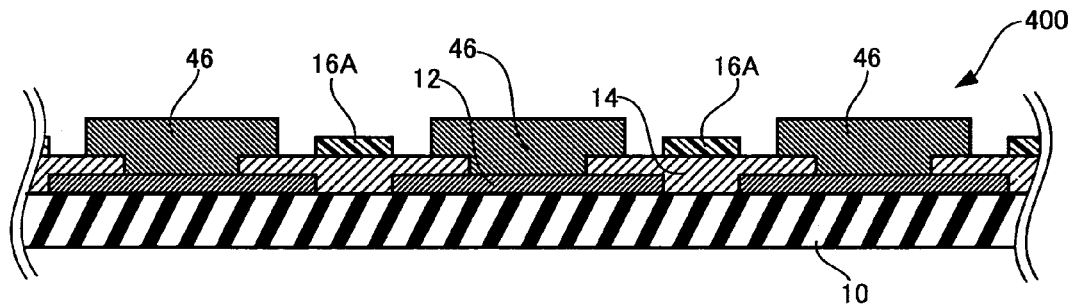
FIG. 8 is a vertical cross-sectional schematic view showing the Forth Example (Example 4) of the semiconductor device of the present invention.
Figure 9:
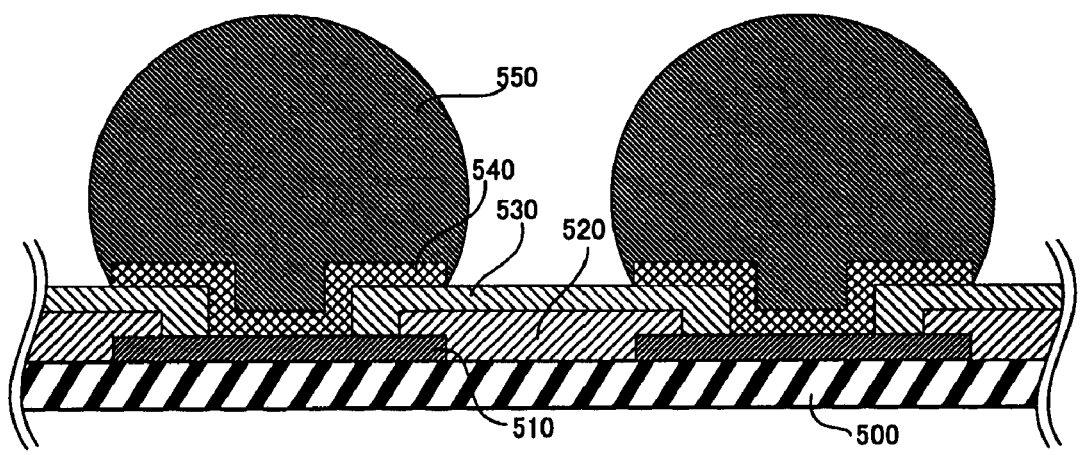
FIG. 9 is a vertical cross-sectional schematic view showing a conventional semiconductor device.

The Fourth Example of the semiconductor device of the present invention is shown in FIG. 8.

In a semiconductor device 400 shown in FIG. 8, a protective layer 16A is selectively formed on the inorganic insulating layer 14 in such a way that it never covers the side surface of the inorganic insulating layer 14 and is separated from the external terminals (bumps) 46.

The protective layer 16A may be less insulative because it is separated from the external terminals (bumps) 46.

The insulating properties of the inorganic insulating layer 14 are reduced because during the manufacturing process carbon is unfavorably incorporated in its surface, thus requiring a process for removing the carbon-containing portion. As demonstrated in this Example, however, such a process can be omitted by selectively forming the protective layer 16A on the inorganic insulating layer 14 in such a way that it is separated from the external terminals (bumps) 46. With this configuration, it is also possible to process the inorganic insulating layer 14 with high precision and thus to readily reduce the dimension of the openings.

The external terminals (bumps) 46 contact the electrode pads 12, with no so-called barrier layers interposed therebetween, and partially extend over the surface of the inorganic insulating layer 14.

Also with this configuration, a formation process for barrier metals can be omitted, thereby enabling low-cost formation of fine external terminals (bumps) arranged at a narrow pitch.

Moreover, since the external terminals (bumps) 46 of this Example are formed on the inorganic insulating layer 14, their height is smaller than that of the external terminals (bumps) 46 in Example 1 by an amount corresponding to the thickness of the organic insulating layer 16. Thus, it is possible to manufacture much smaller semiconductor devices.

According to the present invention, it is possible to solve the foregoing conventional problems and to provide a low-cost, easy-to-use, and efficient method for manufacturing a semiconductor device, which eliminates the need for the formation or removal of barrier metals upon formation of bumps, and a high-performance semiconductor device with fine bumps arranged at a narrow pitch.

The semiconductor device of the present invention has fine bumps arranged at a narrow pitch and is of high performance.

The method of the present invention for manufacturing a semiconductor device eliminates the need for the formation or removal of barrier metals and can manufacture a semiconductor device efficiently and inexpensively. In particular, the method of the present invention is suitable for the manufacturing of the semiconductor device of the present invention.

What is claimed is:

1. A method for manufacturing a semiconductor device, comprising:
    forming a plurality of electrode pads on one surface of a semiconductor substrate;
    forming an insulating layer so as to cover the perimeter of each of the electrode pads;
    selectively forming a mask layer on the insulating layer;
    cleaning the surface of the electrode pads which is not covered with the insulating layer;
    forming external terminals in regions defined by the insulating layer and the mask layer in such a way that the external terminals are directly in contact with the electrode pads and the insulating layer; and
    removing the mask layer.

2. The method for manufacturing a semiconductor device according to claim 1, wherein the step of cleaning the surface of the electrode pads and the step of forming the external terminals are performed under vacuum or reduced pressure.

3. The method for manufacturing a semiconductor device according to claim 2, wherein the step of cleaning the surface of the electrode pads and the step of forming the external terminals are performed in different chambers of the same device.

4. The method for manufacturing a semiconductor device according to claim 1, wherein in the step of cleaning the surface of the electrode pads, an oxide film formed on each of the electrode pads is removed through at least one process selected from the group consisting of ashing, RF sputtering, and reflow using formic acid.

5. The method for manufacturing a semiconductor device according to claim 1, wherein the mask layer is formed of a photoresist layer.

6. The method for manufacturing a semiconductor device according to claim 5, wherein the mask layer is formed by selectively exposing and developing the photoresist layer.

7. The method for manufacturing a semiconductor device according to claim 1, wherein the step of forming the external terminals is performed by charging a mixture of a metal and a curable resin in regions above the electrode pads which are defined by the insulating layer and the mask layer, and wherein the curable resin is at least one of a thermosetting resin and a photocurable resin.

8. The method for manufacturing a semiconductor device according to claim 1, wherein the external terminals are formed in such a way that the external terminals are substantially as high as the mask layer.

9. The method for manufacturing a semiconductor device according to claim 1, wherein the diameter of the external terminals is 100 µm or less.

10. The method for manufacturing a semiconductor device according to claim 1, wherein the distance between the adjacent external terminals is 150 µm or less.

11. A semiconductor device, comprising:
    a plurality of electrode pads formed on one surface of a semiconductor substrate;
    an insulating layer covering the perimeter of each of the electrode pads; and
    external terminals formed on the electrode pads and the insulating layer so as to be directly in contact with the electrode pads and the insulating layer.

12. The semiconductor device according to claim 11, wherein the external terminals are formed of a mixture of a metal and a curable resin, and wherein the curable resin is at least one of a thermosetting resin and a photocurable resin.

13. The semiconductor device according to claim 11, wherein the distance between the adjacent external terminals is 150 µm or less.

14. A semiconductor device according to claim 11, wherein the external terminals have a surface that is substantially parallel to the surface of the electrode pads.

* * * * *